(12) United States Patent
Buffa et al.

(10) Patent No.: US 10,401,409 B2
(45) Date of Patent: Sep. 3, 2019

(54) CAPACITANCE DETERMINATION CIRCUIT AND METHOD FOR DETERMINING A CAPACITANCE

(71) Applicant: Infineon Technologies Austria AG, Villach (AT)

(72) Inventors: Cesare Buffa, Villach (AT); Luis Hernandez-Corporales, Madrid (ES); Andreas Wiesbauer, Poertschach (AT); Enrique Prefasi, Madrid (ES)

(73) Assignee: Infineon Technologies Austria AG, Villach (AT)

( * ) Notice: Subject to any disclaimer, the term of this patent is extended or adjusted under 35 U.S.C. 154(b) by 421 days.

(21) Appl. No.: 15/135,611

(22) Filed: Apr. 22, 2016

(65) Prior Publication Data
US 2017/0307668 A1 Oct. 26, 2017

(51) Int. Cl.
| | |
|---|---|
| G01R 27/22 | (2006.01) |
| H03L 7/06 | (2006.01) |
| H03L 7/08 | (2006.01) |
| G01R 27/26 | (2006.01) |
| H03K 3/03 | (2006.01) |
| H03K 23/50 | (2006.01) |

(52) U.S. Cl.
CPC ....... *G01R 27/2605* (2013.01); *H03K 3/0315* (2013.01); *H03K 23/50* (2013.01)

(58) Field of Classification Search
CPC .......... G01R 27/22; G01R 27/26; H03K 3/03; H03K 23/50; H03L 7/06; H03L 7/08
See application file for complete search history.

(56) References Cited

U.S. PATENT DOCUMENTS

| | | | | |
|---|---|---|---|---|
| 5,170,130 A | * | 12/1992 | Ichihara | H03L 7/0891 327/157 |
| 6,437,615 B1 | * | 8/2002 | Stascausky | H03H 11/405 327/156 |
| 6,593,783 B2 | * | 7/2003 | Ichimaru | H03L 7/0891 327/156 |
| 7,132,835 B1 | * | 11/2006 | Arcus | G01R 31/3004 324/523 |

(Continued)

OTHER PUBLICATIONS

Jung et al., "A 0.7pF-to-10nF Fully Digital Capacitance-to-Digital Converter Using Iterative Delay-Chain Discharge", IEEE International Solid-State Circuits Conference, Feb. 2015, pp. 484-486, IEEE, USA.

(Continued)

*Primary Examiner* — Neel D Shah
(74) *Attorney, Agent, or Firm* — Viering, Jentschura & Partner MBB

(57) ABSTRACT

According to an embodiment, a capacitance determination circuit is provided comprising a voltage controlled oscillator configured to generate a frequency signal whose frequency depends on a control voltage supplied to the voltage controlled oscillator, a capacitor coupled to the voltage controlled oscillator wherein the control voltage depends on a voltage across the capacitor and a processing circuit configured to generate, based on the frequency signal generated by the voltage controlled oscillator over a time interval comprising at least one phase in which the capacitor is charged and comprising at least one phase in which the capacitor is discharged, an indication of the capacitance of the capacitor.

20 Claims, 13 Drawing Sheets

(56) References Cited

U.S. PATENT DOCUMENTS

| | | | | |
|---|---|---|---|---|
| 2004/0085104 A1* | 5/2004 | Sanchez | ............... | H03K 4/023 |
| | | | | 327/157 |
| 2009/0009223 A1* | 1/2009 | Doi | ............... | H03L 7/0895 |
| | | | | 327/157 |
| 2009/0039973 A1* | 2/2009 | Kitayama | ............... | H03L 1/026 |
| | | | | 331/360 |
| 2009/0237036 A1* | 9/2009 | Ikeda | ............... | H03L 7/093 |
| | | | | 320/166 |
| 2010/0148732 A1* | 6/2010 | Lynch | ............... | H02J 7/345 |
| | | | | 320/166 |
| 2011/0050472 A1* | 3/2011 | Melanson | ............... | H03M 3/474 |
| | | | | 341/143 |
| 2013/0093478 A1* | 4/2013 | Wong | ............... | H03L 7/0995 |
| | | | | 327/156 |
| 2014/0270261 A1 | 9/2014 | Wiesbauer et al. | | |

OTHER PUBLICATIONS

Watanabe et al., "An All-Digital A/D Converter TAD with 4-Shift-Clock Construction for Sensor Interface in 0.65-μm CMOS", ESSCIRC, Sep. 2010, pp. 178-181, IEEE, Sevilla/Spain.

Terasawa et al., "Electrostatically Levitated Ring-Shaped Rotational-Gyro/Accelerometer Using All-Digital OFDM Detection With TAD", Sensors, Oct. 2012, 4 pages, IEEE, Taipei/Taiwan.

Hovin et al., "Delta-Sigma Modulators using Frequency-Modulated Intermediate Values", IEEE Journal of Solid-State Circuits, Jan. 1997, pp. 1-10, vol. 32, Issue 1, IEEE.

* cited by examiner

CAPACITANCE DETERMINATION CIRCUIT AND METHOD FOR DETERMINING A CAPACITANCE

TECHNICAL FIELD

The present disclosure relates to capacitance determination circuits and methods for determining a capacitance.

BACKGROUND

For reading out a capacitive MEMS (Microelectromechanical system) sensor, a readout circuit may be used which is based on biasing the sensor with a known voltage and sensing current or biasing a sensor capacitance at a known amount of charge and sensing voltage variations. However, this requires biasing references which may imply the use of charge pumps at the extra cost of area, current consumption and eventual need for high voltages devices, i.e. capacitors. Accordingly, MEMS circuit readout circuits which are more efficient, e.g. in terms of chip area and power consumption are desirable.

SUMMARY

According to an embodiment, a capacitance determination circuit is provided including a voltage controlled oscillator configured to generate a frequency signal whose frequency depends on a control voltage supplied to the voltage controlled oscillator, a capacitor coupled to the voltage controlled oscillator wherein the control voltage depends on a voltage across the capacitor and a processing circuit configured to generate, based on the frequency signal generated by the voltage controlled oscillator over a time interval including at least one phase in which the capacitor is charged and including at least one phase in which the capacitor is discharged, an indication of the capacitance of the capacitor.

According to another embodiment, a method for determining a capacitance according to the above capacitance determination circuit is provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Figure 1:
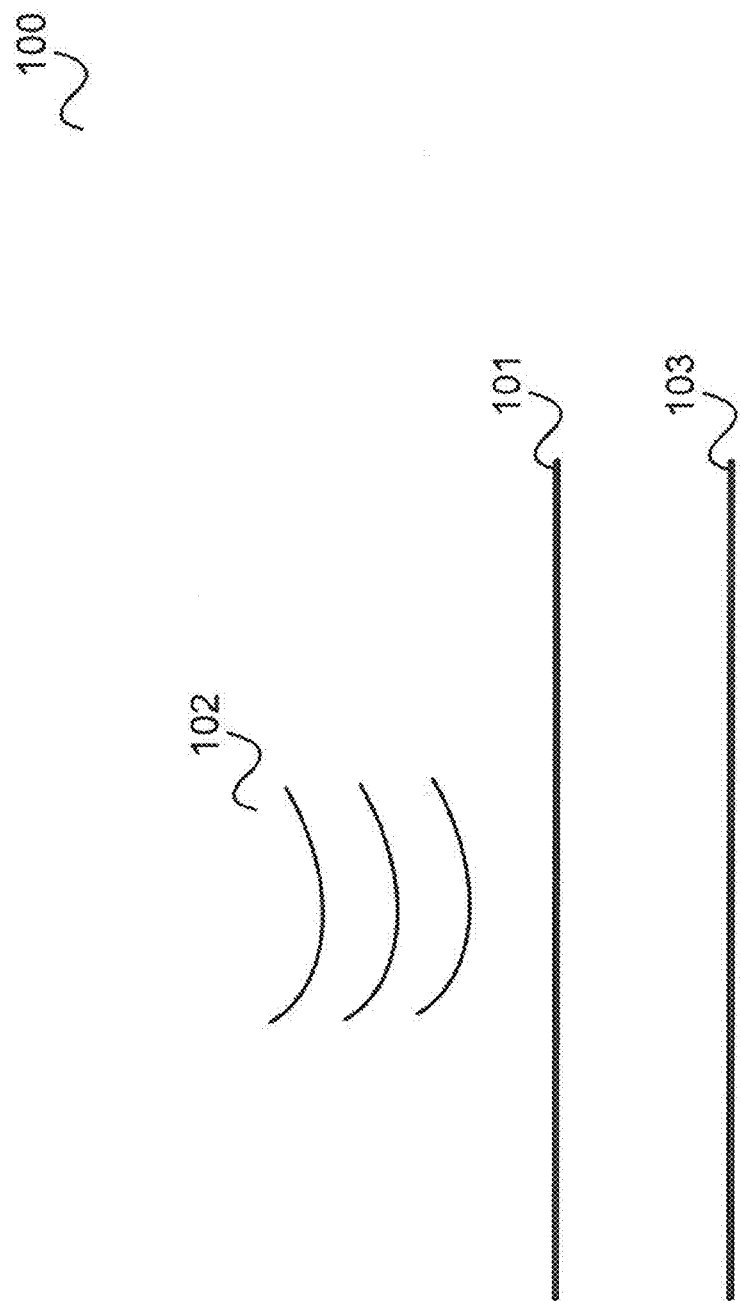
FIG. 1 shows a MEMS microphone.

FIG. 1 shows, as an example of a MEMS (microelectromechanical system) device or MEMS sensor, a microphone 100 which has a diaphragm 101 that is exposed to incident pressure waves 102. A MEMS microphone can be seen as a capacitor consisting of the diaphragm 101 and a counter electrode 103, more commonly referred to as a backplate. When sound waves cause the diaphragm to oscillate, the sound waves can be converted into useable electrical signals by measuring the change in capacitance caused by the movement of the diaphragm relative to the backplate. An approach of accomplishing increased sensitivity is the addition a second backplate on the side of the diaphragm opposite that of the backplate 103 (referred to as dual backplate). Many MEMS pressure sensors likewise employ the various transduction mechanisms to sense a change in atmospheric pressure.

For reading out a MEMS sensor, i.e. for determining its capacitance, the MEMS capacitor may be pre-charged to a fixed voltage and may then be let to discharge through a ring oscillator, counting the number of pulses for a fixed time. The capacitor discharge modulates the frequency of the ring oscillator and therefore counting number of pulses reveals information about capacitance. However, this may not be directly applied to a microphone because the required resolution and sampling speed and the size of the microphone MEMS capacitor typically makes it hard to be implemented.

A capacitive MEMS sensor may also be read out by applying a high-bias voltage and using a transconductor to drive a ring oscillator. Thus, the analog to digital (A/D) conversion does not need a voltage-domain analog to digital converter (like a sigma-delta modulator or a SAR (successive approximation register)) but uses the voltage to frequency conversion of a ring oscillator and seizes the high gain in the voltage to frequency conversion to avoid extra signal conditioning preamplifiers.

According to various embodiments, as described in the following, instead of making one measurement per discharge (e.g. counting the number of pulses of a ring oscillator for one discharge) noise shaping and oversampling is applied and measurements with low resolution but in higher number (i.e. very often) are performed. In other words, embodiments can be seen to be based on integrating noise shaping and oversampling in an approach where a capacitor discharge modulates the frequency of an oscillator.

Figure 2:
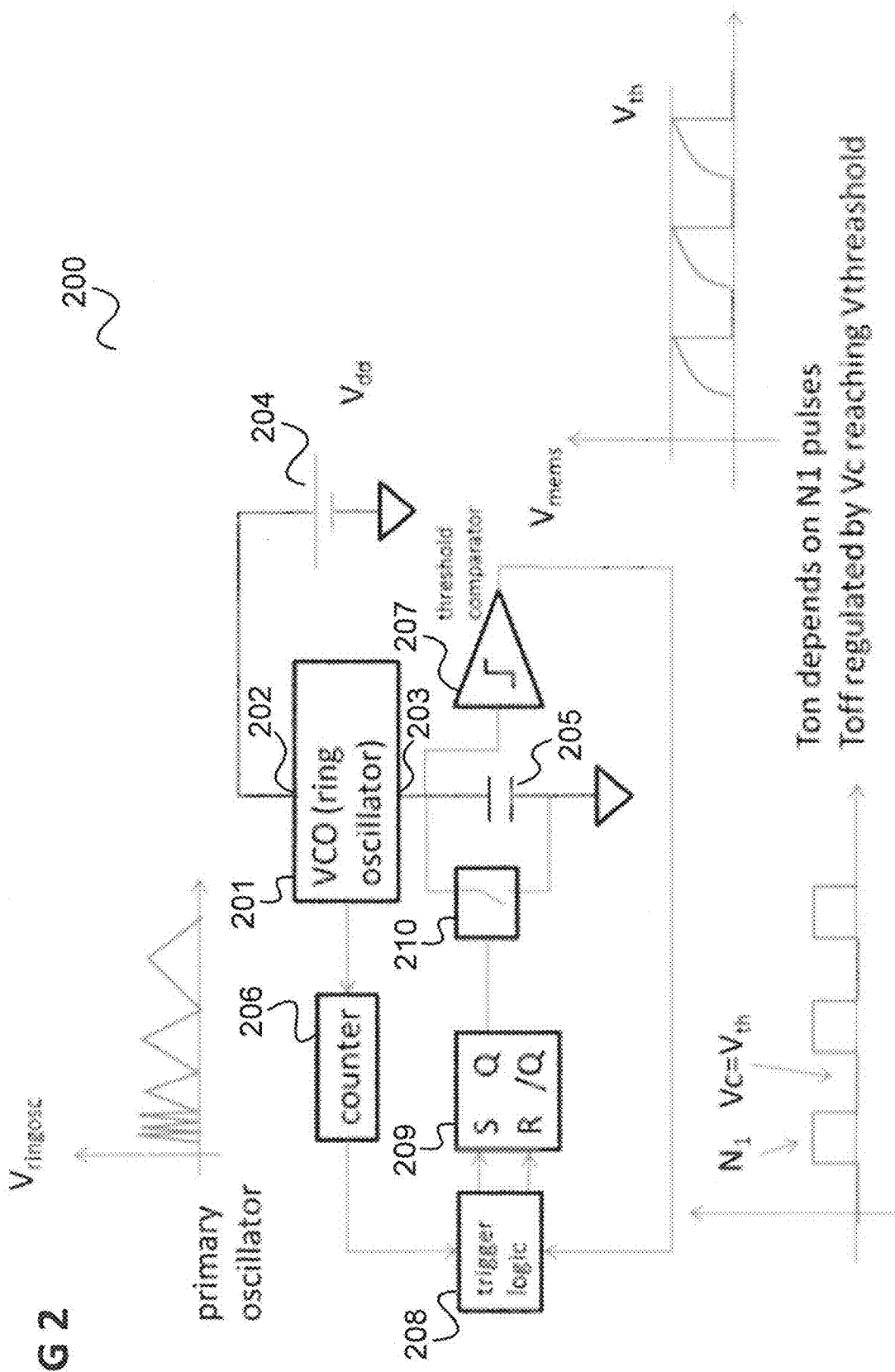
FIG. 2 shows a readout circuit for a MEMS sensor according to an embodiment.

FIG. 2 shows a readout circuit 200 according to an embodiment.

The readout circuit 200 includes an oscillator 201 whose frequency and power consumption depend on its supply voltage applied at a first supply terminal 202 and a second supply terminal 203. An example for the oscillator 201 is a ring oscillator implemented with logic inverters. The oscillator is powered by a constant DC supply 204 which is coupled between its first supply terminal 202 and ground and the voltage of the MEMS sensor to be read out, indicated by a capacitor 205 (whose value changes with the magnitude to measure) which is connected between the oscillator's second supply terminal 203 and ground.

The oscillator 201 generates a frequency signal or oscillation signal which is for example AC decoupled and buffered to reach the desired logic levels and then applied to a frequency divider 206, e.g. implemented by means of a counter. The voltage at the MEMS capacitor 205 is also sensed and compared with a reference threshold Vth by means of a voltage comparator 207. The output of the frequency divider 206 and the output of the voltage comparator 207 are supplied to a trigger logic 208 that decides when to activate a set-reset flip-flop 209 depending on the conditions of the voltage comparator output and the frequency divider output and controls the set-reset flip-flop 209 according to the decision. The output of the set-reset flip-flop 209 controls an analog switch 210 that can either short the MEMS capacitor 205 or is left open.

For example, the flip-flop's output is high at reset and the MEMS capacitor 205 is then shorted and the oscillator 201 oscillates at its maximum frequency $f_{max}$ as the DC supply 204 is connected in parallel with it.

After a predetermined number of $N_1$ pulses the frequency divider 206 output goes low informing the trigger logic (also referred to as control logic) 208 accordingly which in response releases (opens) the switch 210 via the flip-flop 209. Thus, there are pulses in the switch control signal (i.e. the flip-flop output) that are at high logic level for a fixed time $T_{on}=N_1/(2f_{max})$.

When the switch 210 is released current will flow through the MEMS capacitor 205 which will become charged and reduces the voltage between the supply terminals 202, 203 of the oscillator 201. Thus, the frequency of the oscillator 201 is modulated by the voltage across the MEMS capacitor 205.

The voltage comparator 207 notifies the trigger logic 208 when the voltage across the capacitor 205 has reached a threshold voltage $V_{th}$. When this happens, the trigger logic 208 activates (closes) the switch 210 via the flip-flop 209 to discharge the capacitor 205 again. Thus, the off time $T_{off}$ (switch 210 open) depends on the exponential charge of the capacitor 205 which depends on its capacitance $C_{MEMS}$, i.e. $T_{off}=f(C_{mems})$. After $T_{on}+T_{off}$, the cycle repeats and the frequency of the resulting oscillation at the output of the flip-flop 210 (i.e. of the control signal) is $f_{oso}=1/(T_{on}+T_{off})$ which depending on the MEMS capacitance 205.

Figure 3:
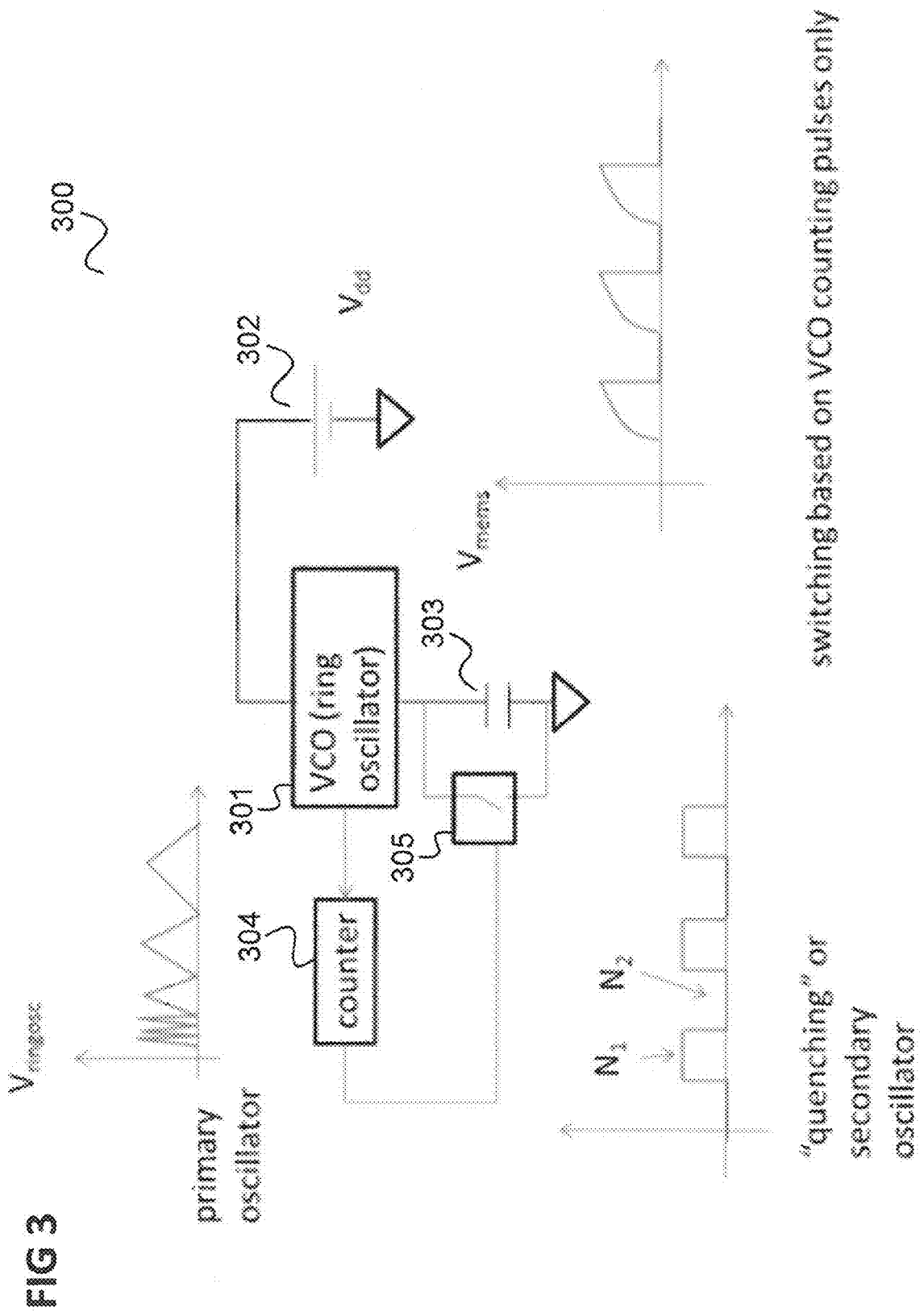
FIG. 3 shows a readout circuit according to another embodiment.

An alternative implementation in which the voltage comparator 207 is not used is shown in FIG. 3.

FIG. 3 shows a readout circuit 300 according to another embodiment.

Similarly to the readout circuit 200, the readout circuit 300 includes an oscillator 301, a DC supply 302, a capacitor 303, a frequency divider 304 and a switch 305. However, in contrast to the readout circuit 200, the trigger logic 208, the flip-flop 209 and the comparator 207 are omitted. In particular, the output of the frequency divider 304 is directly connected to the switch 305.

Further, similarly to the readout circuit 200, after a predetermined number of $N_1$ pulses the frequency divider 206 output goes low which opens the switch 305. Thus, there are pulses in the switch control signal (i.e. in this case the frequency divider output) that are at high logic level for a fixed time $T_{on}=N_1/(2f_{max})$ followed by a period during which the switch control signal is low.

Then, after another predetermined number of $N_2$ pulses, the output of the frequency divider 304 goes high again such that the next cycle of the control signal begins. The off time (control signal low) depends on the exponential charge of the MEMS which in turn depends on its capacitance, i.e. $T_{off}=f(C_{mems})$. After the N1+N2 oscillator pulses, the cycle repeats such that the frequency of the control signal oscillation is $f_{osc}=1/(T_{on}+T_{off})$ depending on the MEMS capacitance 303.

This implementation benefits from that only the phase noise of the oscillator 301 influences the capacitance measurement but has reduced linearity (which can however be addressed at system level by using a differential sensor). The implementation of FIG. 2 is more linear but the voltage comparator 207 and threshold reference noises contribute to the phase noise of the overall oscillator which degrades the SNR (signal-to-noise ratio). Parasitics can be compensated in the readout circuits 200, 300.

The readout circuits 200, 300 can each be seen as a dual oscillator with a primary oscillation frequency, that of the ring oscillator or VCO 201, 301, and a secondary oscillation or quenching frequency that controls the switch, i.e. of the control signal which is the output of the flip-flop 209 or the frequency divider 304, respectively.

For both implementations, i.e. both readout circuits 200, 300, an important consequence is that phase coherence is retained at the transition between the $T_{on}$ and the $T_{off}$ period (and vice versa) in the main oscillator 201, 301 and the oscillator is not stopped between charging and discharging phases. Therefore, a first order noise-shaped signal can be extracted by counting and differentiating the oscillator pulses of the control signal.

It should be noted that as an alternative implementation, the switch 210, 305 may be arranged in series with the MEMS 205, 303 and the MEMS 205, 303 in parallel with the VCO 201, 301. This can be used to produce the same results.

In readout circuits according to various embodiments, e.g. as illustrated in FIGS. 2 and 3, no biasing high voltage is needed to measure the MEMS capacitance. Thus, area occupation can be kept low and the necessity for high-voltage capacitors is avoided. Further, a high frequency and high sensitivity VCO can be made to change its frequency depending on the MEMS capacitance without having to drive pads and the MEMS with the oscillation frequency directly. Instead, a down divided version (the secondary oscillation, i.e. the control signal) is applied to the MEMS that represents smaller parasitic losses and power leakage. Thus, power consumption can be kept low.

It should be noted that the discharge of the MEMS is not linear. In most MEMS sensors the capacitance variation is very small compared to the nominal value and the non-linear behavior can be linearized around the operating point. Further, the readout circuit according to an embodiment can be extended to a differential implementation at the cost of doubling the area (as it is typical for a single to differential (e.g. ASIC) extension).

Figure 4:
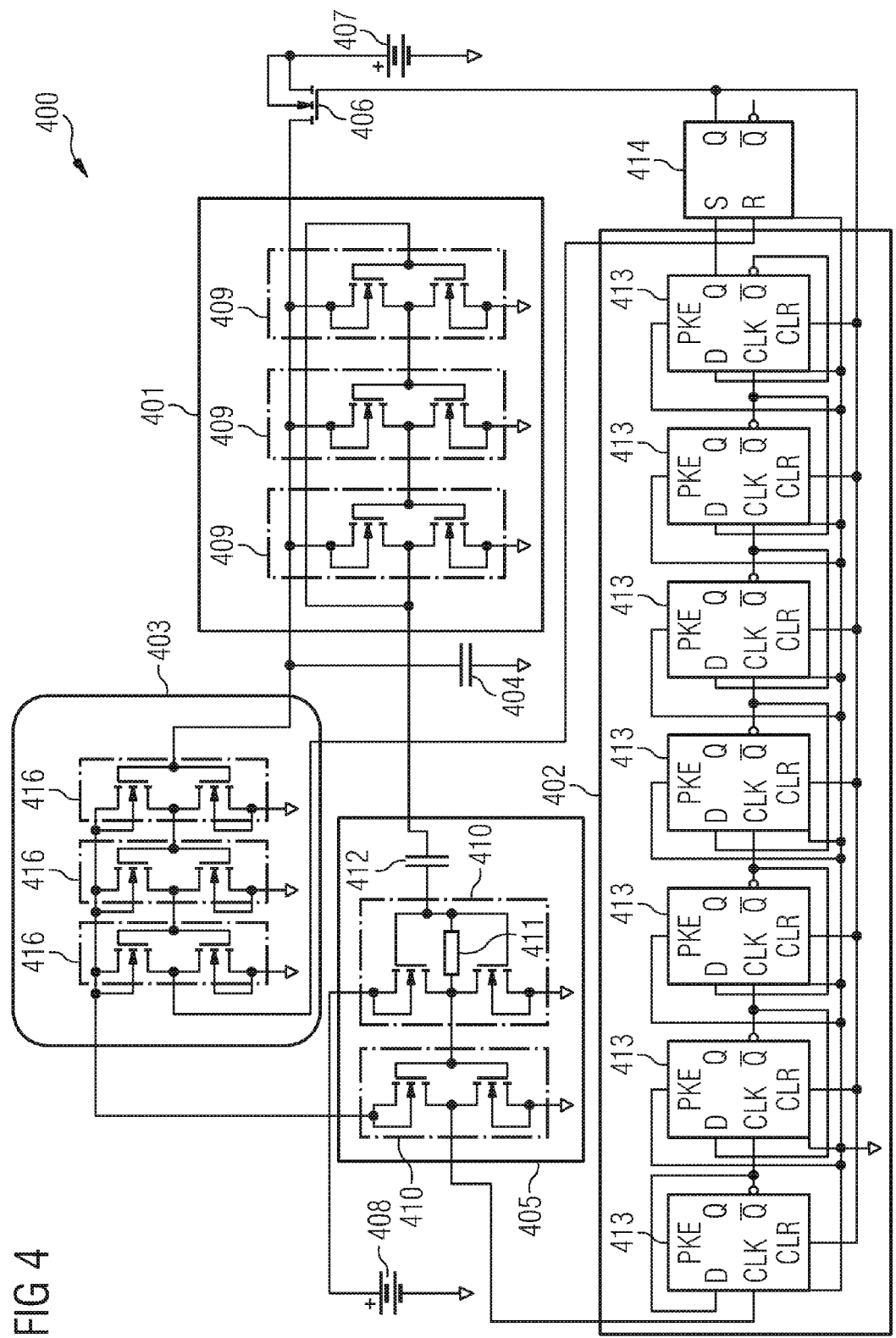
FIG. 4 shows a CMOS implementation of the readout circuit of FIG. 2.

FIG. 4 shows a readout circuit 400 as an example for a CMOS implementation of the readout circuit 200 of FIG. 2.

The readout circuit 400 includes a ring oscillator 401 corresponding to the VCO 301, a frequency divider 402 corresponding to the frequency divider 206, a voltage comparator 403 corresponding to the comparator 207, a MEMS capacitor 404 corresponding to the MEMS capacitor 205, a buffer 405 between the output of the ring oscillator 401 and the input of the frequency divider 402. In this implementation, as mentioned above, the MEMS capacitor 404 is arranged in parallel to the ring oscillator 401 and a field effect transistor 406 corresponding to the switch 210 is arranged between the parallel connection of the ring oscillator 401 and the MEMS capacitor 404 and a first DC supply 407 corresponding to the DC supply 204. A second DC supply 408 supplies the buffer 405. The ring oscillator 401 is implemented by a serial connection of three first inverters 409 with a feedback loop. Each inverter 409 is implemented by a serial connection of two field effect transistors connected between the ring oscillator's supply input connected to the field effect transistor 406 (corresponding to the first supply terminal 202) and ground.

The buffer 405 is implemented by a serial connection of two second inverters 410. As shown, the second inverter 410 at the input of the buffer 405 may include a resistor 411 between its input and its output and the buffer may include a capacitor 412 at its input.

The frequency divider is implemented by a chain of D-flip-flops 413 wherein for each flip-flop 413, the inverting output is fed back to its input and connected to the clock input of the following flip-flop 413, except for the first whose clock input is the frequency divider's input and the last whose non-inverting output is the frequency divider's output. The frequency divider's output is connected to the set input of an RS-flip-flop 414 corresponding to the flip-flop 210.

The (non-inverting) output of the flip-flop 210 is coupled to the reset (or clear) input of the flip-flops 413 and is coupled to the field effect transistor 406.

The voltage comparator 403 is implemented by a serial connection of three second inverters 416. Each inverter 416 is implemented by a serial connection of two field effect transistors connected between the second DC supply and ground.

The output of the second voltage comparator 403 is connected to the reset input of the flip-flop 414.

Figure 5:
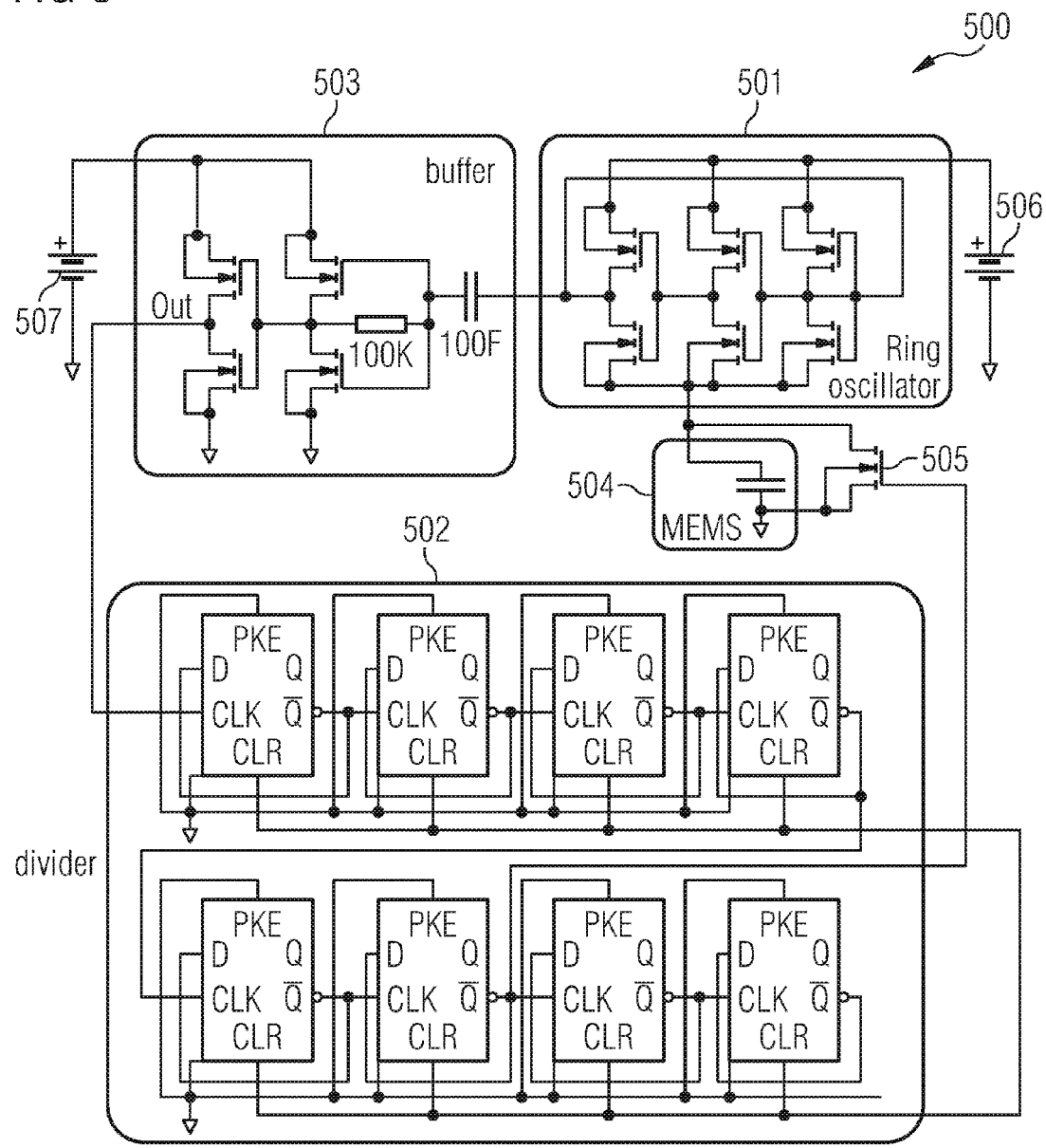
FIG. 5 shows a CMOS implementation of the readout circuit of FIG. 3.

FIG. 5 shows a readout circuit 500 as an example for a CMOS implementation of the readout circuit 300 of FIG. 3.

Similarly to the readout circuit 400, the readout circuit 500 includes a ring oscillator 501 corresponding to the VCO 301, a frequency divider 502 corresponding to the frequency divider 304, a buffer 503, a MEMS capacitance 504, a switch 505 corresponding to the switch 305 and DC supplies 506, 507. In this implementation, the switch 505 is in parallel to the MEMS capacitance 504 as shown in FIG. 3.

In this example, the output of the frequency divider 502 is the inverting output of the third to last flip-flop which is supplied to the field effect transistor 505.

Figure 6:
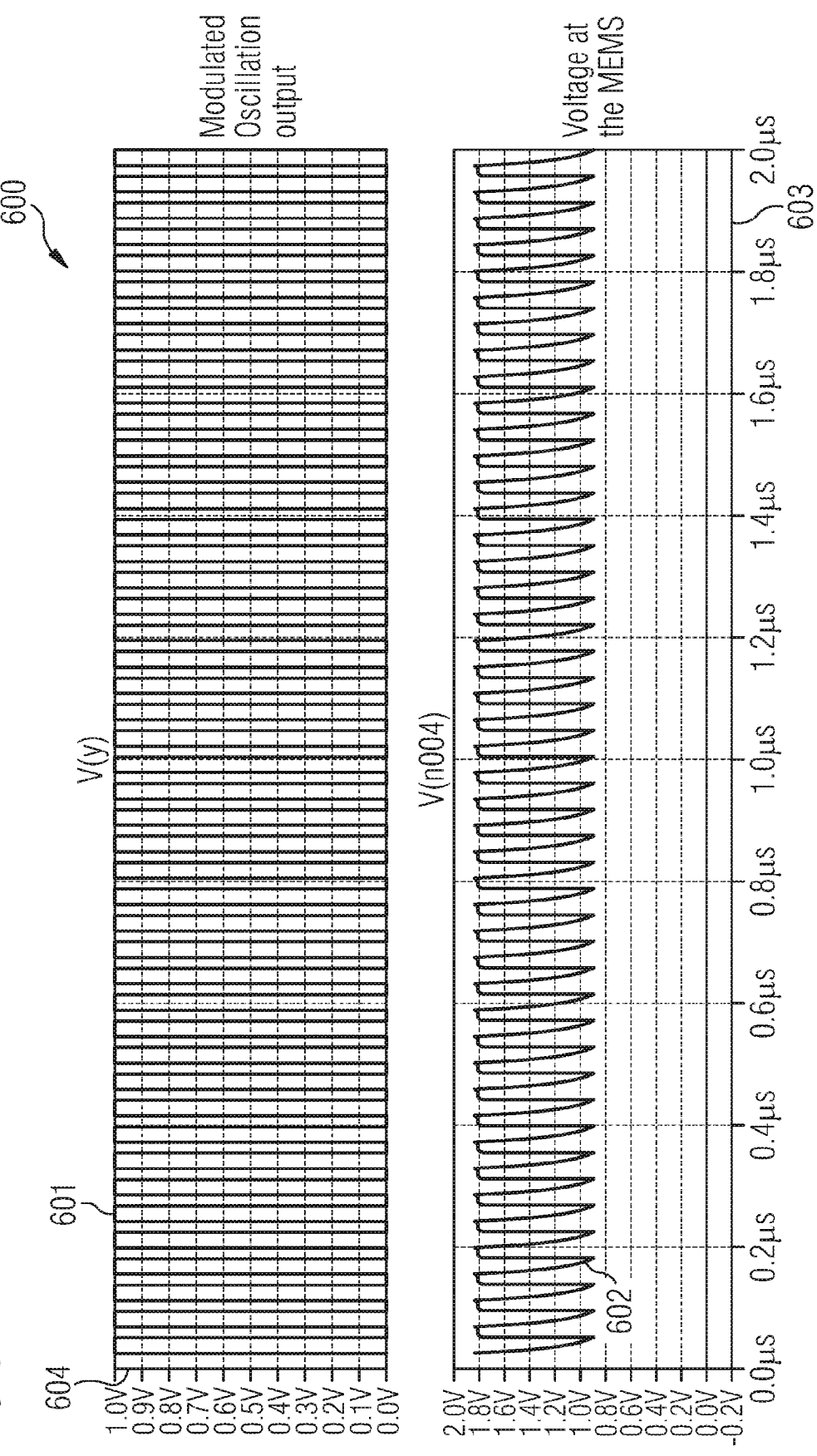
FIG. 6 shows a simulation result for the readout circuit of FIG. 4.

FIG. 6 shows a simulation result for the readout circuit 400 of FIG. 4.

A first curve 601 shows the output of the flip-flop 414 and a second curve 602 shows the voltage at the MEMS capacitance 404. Both curves 601, 602 use the same time scale given by the horizontal axis 603 and the corresponding level increases from bottom to top along the vertical axis 604.

Figure 7:
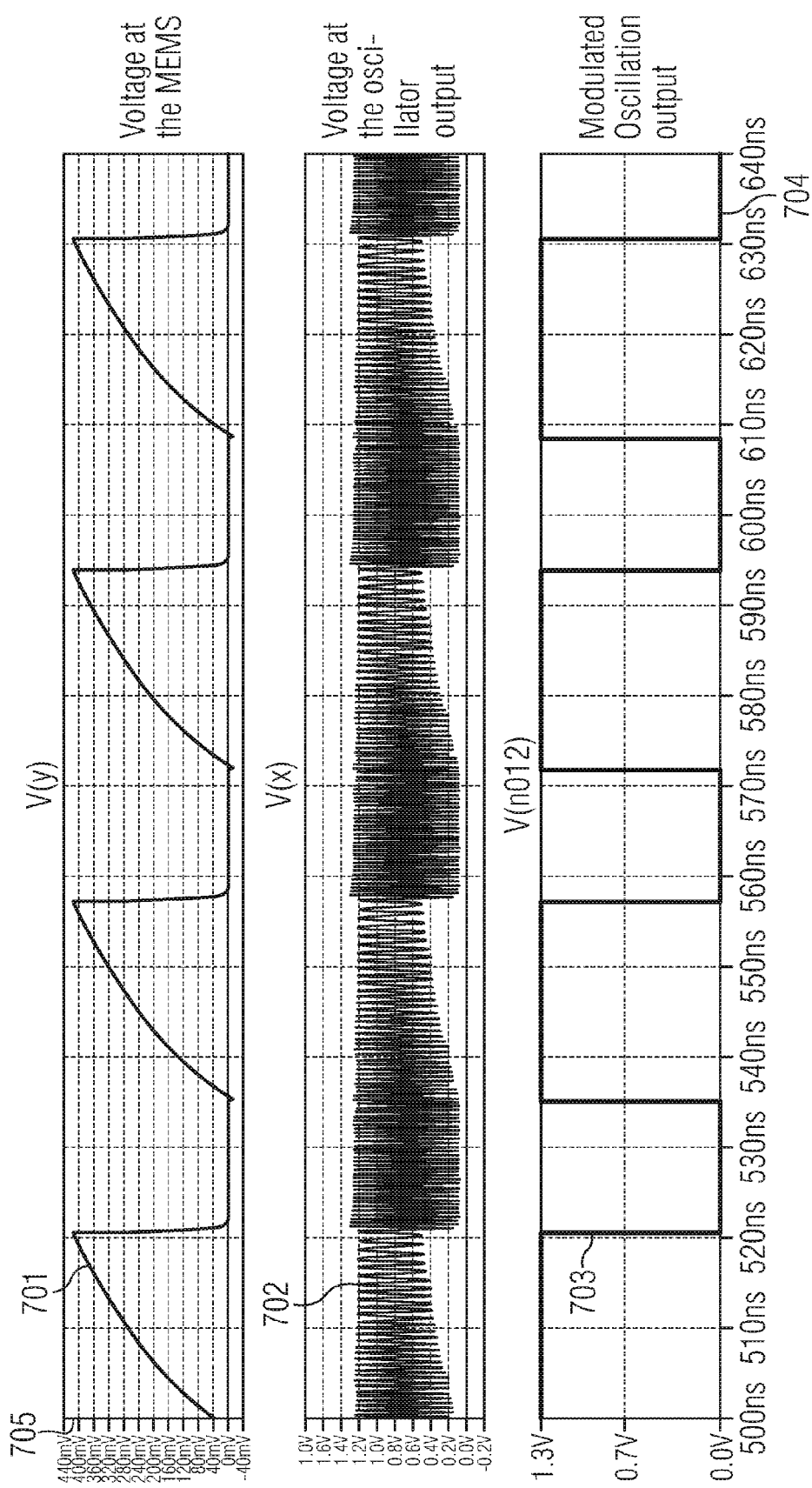
FIG. 7 shows a simulation result for the readout circuit of FIG. 5.

FIG. 7 shows a simulation result for the readout circuit 500 of FIG. 5.

A first curve 701 shows the voltage at the MEMS capacitance 504, a second curve 702 shows the output of the oscillator 501 and a third curve 703 shows the output of the frequency divider 502. All curves 701, 702, 703 use the same time scale given by the horizontal axis 704 and the corresponding level increases from bottom to top along the vertical axis 705.

Figure 8:
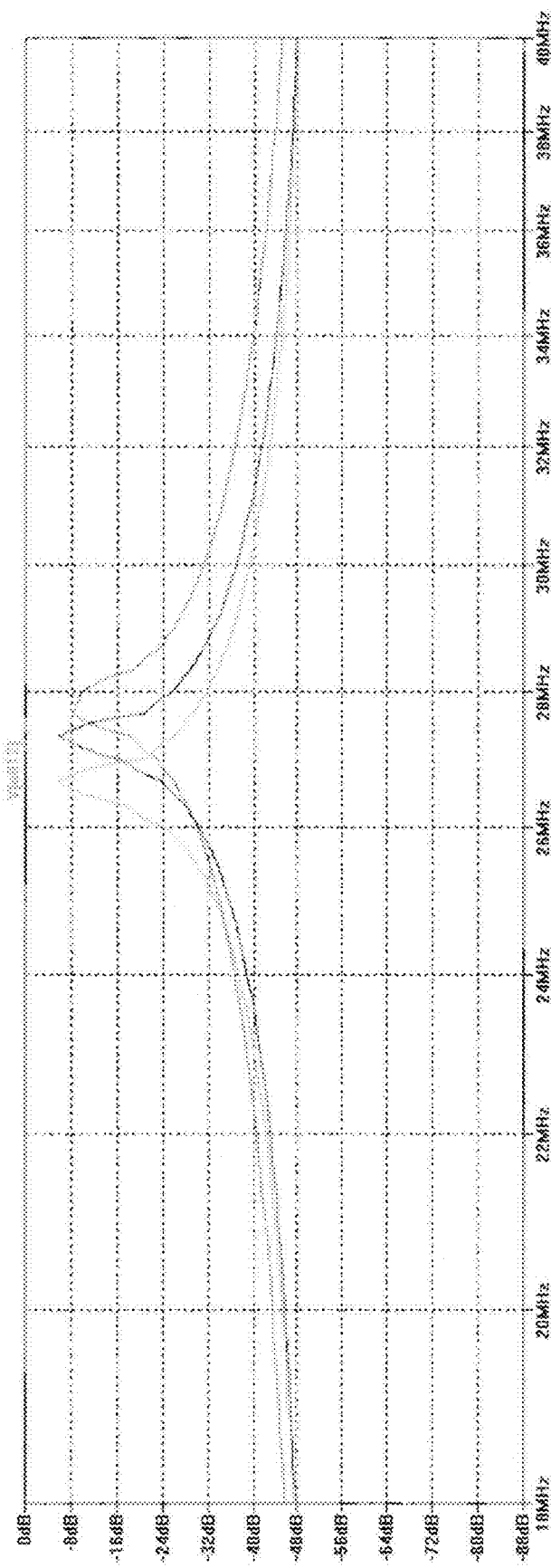
FIG. 8 shows the FFT of examples of the control signal according to one embodiment.

FIG. 8 shows the FFT of the control signal in an embodiment for a MEMS capacitance of 1.5 pF and for variations of 10% from the nominal value (i.e. for 1.5 pF+10% and 1.5 pF-10%). For the nominal capacitance the secondary oscillation frequency is 27 MHz. It can be seen that the capacitance is clearly reflected in frequency components of the control signal.

The output of the readout circuit, i.e. the control signal (for the switch 210, 305 in the above examples), which can be seen as frequency modulated signal, can be sampled and differentiated or used as the input to a frequency to digital converter with higher noise shaping order. This is illustrated in FIG. 9.

Figure 9:
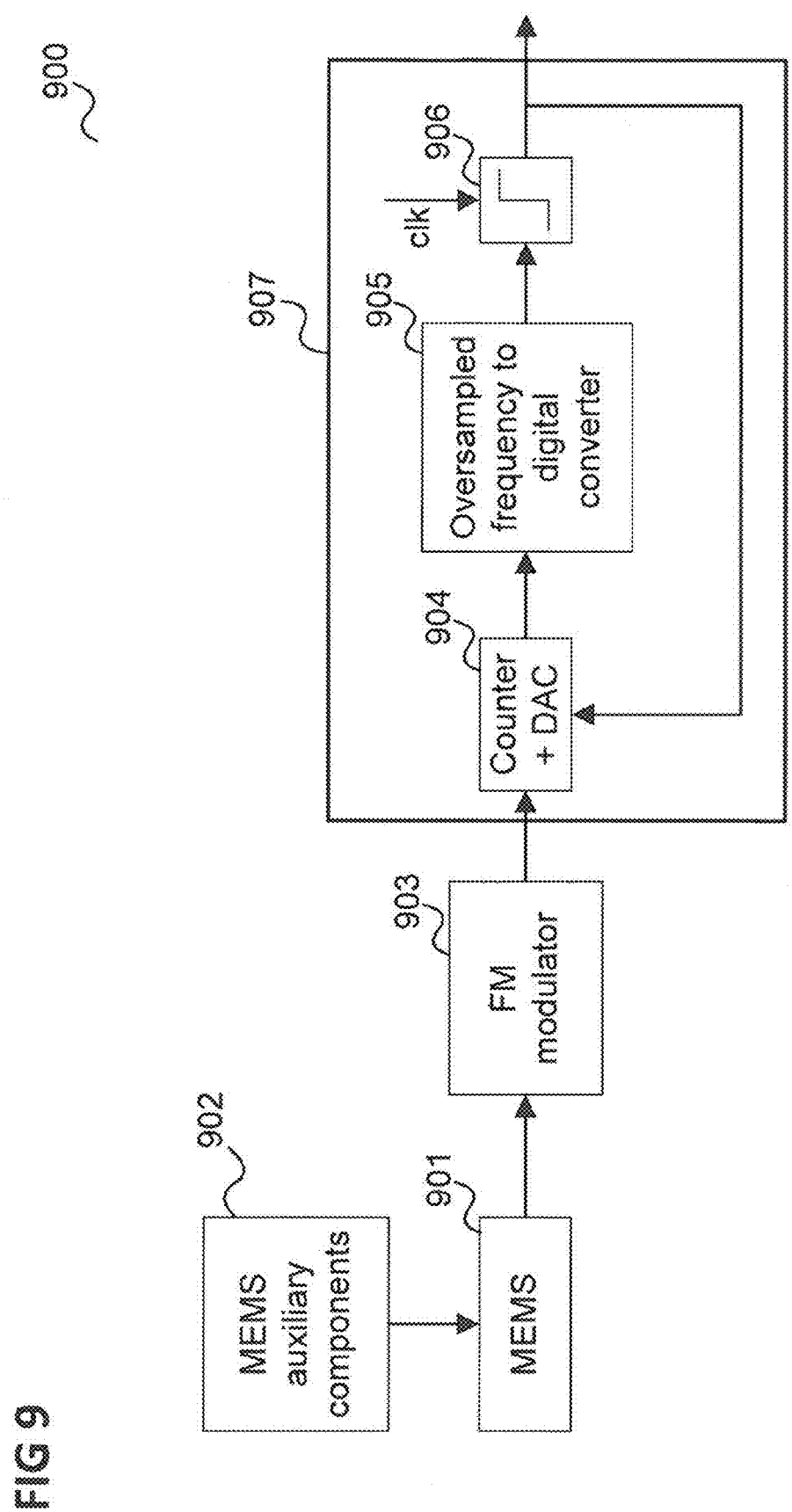
FIG. 9 shows a MEMS readout arrangement according to an embodiment.

FIG. 9 shows a MEMS readout arrangement 900.

The arrangement 900 includes a MEMS 901 which may be coupled to MEMS auxiliary components 902. A FM modulator 903 generates an oscillation signal which depends on the capacitance of the MEMS 901. The oscillation signal for example corresponds to the control signal of the above examples. The oscillation signal is supplied to a frequency-to-digital sigma delta modulator 907 which generates a digital signal which represents the MEMS capacitance, e.g. a digital value specifying the MEMS capacitance.

The frequency-to-digital sigma delta modulator 907 includes a block 904 including an accumulator followed by a digital-to-analog converter whose output is supplied to an oversampled frequency to digital converter 905. The output of the frequency to digital converter 905 is supplied to a (clocked) quantizer whose output is the digital output indicating the measured capacitance and whose output is fed back to the accumulation and DAC block 904.

In the implementations shown in FIGS. 4 and 5, according to one embodiment, the inverters of the ring oscillators 401, 501 are implemented with a triple-well process because the n channel MOSFET (metal oxide semiconductor field effect transistor) bulks are not connected to ground but are connected to the respective transistor sources. The bulk n channel MOSFETs are not connected to ground because the source voltage of the transistors is intrinsically changing due to readout circuits' working principle and this means threshold voltage variation.

For reducing production costs, an alternative implementation may be used which does not require triple-well technology. This is illustrated in FIG. 10.

Figure 10:
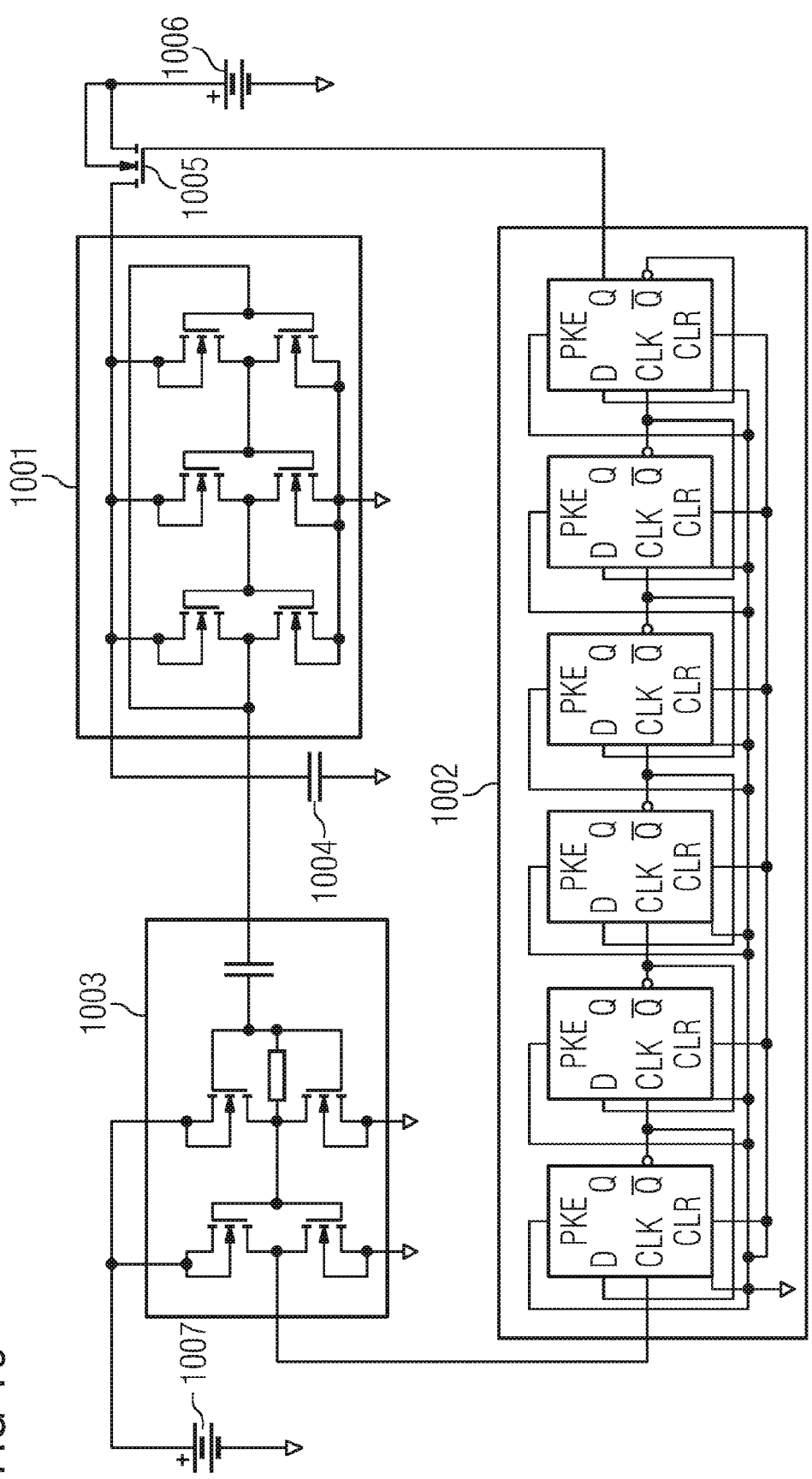
FIG. 10 shows a CMOS implementation of the readout circuit of FIG. 3.

FIG. 10 shows a readout circuit 1000 as an example for a CMOS implementation of the readout circuit 300 of FIG. 3.

Similarly to the readout circuit 500, the readout circuit 1000 includes a ring oscillator 1001, a frequency divider 1002, a buffer 1003, a MEMS capacitance 1004, a switch 1005 and DC supplies 1006, 1007. In this implementation, the switch 1005 is in series to the MEMS capacitance 1004 as in case of the readout circuit 400 of FIG. 4.

Specifically, the switch 1005 is implemented by means of a p channel MOSFET in series to the ring oscillator which is connected in parallel to the MEMS capacitance 1004. Thus, lower current consumption can be achieved because all the energy stored in the capacitor 1004 is used to supply the oscillator 1001.

Figure 11:
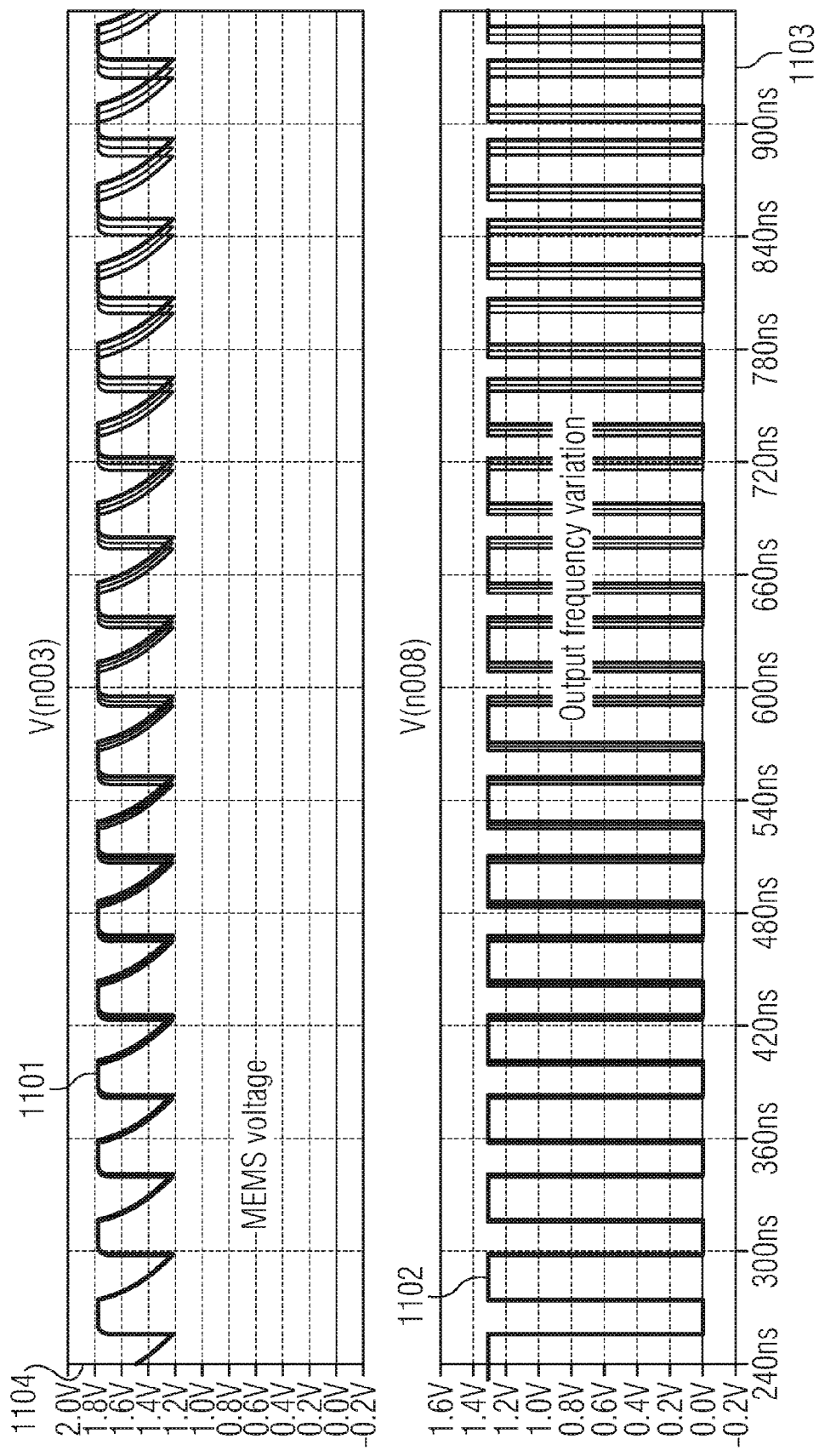
FIG. 11 shows a simulation result for the readout circuit of FIG. 10.

FIG. 11 shows a simulation result for the readout circuit 1000 of FIG. 10.

First curves 1101 shows the voltage at the MEMS capacitance 1004 with voltage variation at MEMS capacitance (i.e. for varying voltages) and second curves 1102 show the corresponding outputs of the frequency divider 1002 (with frequency variation). The curves 1101, 1102 use the same time scale given by the horizontal axis 1103 and the corresponding level increases from bottom to top along the vertical axis 1104.

Figure 12:
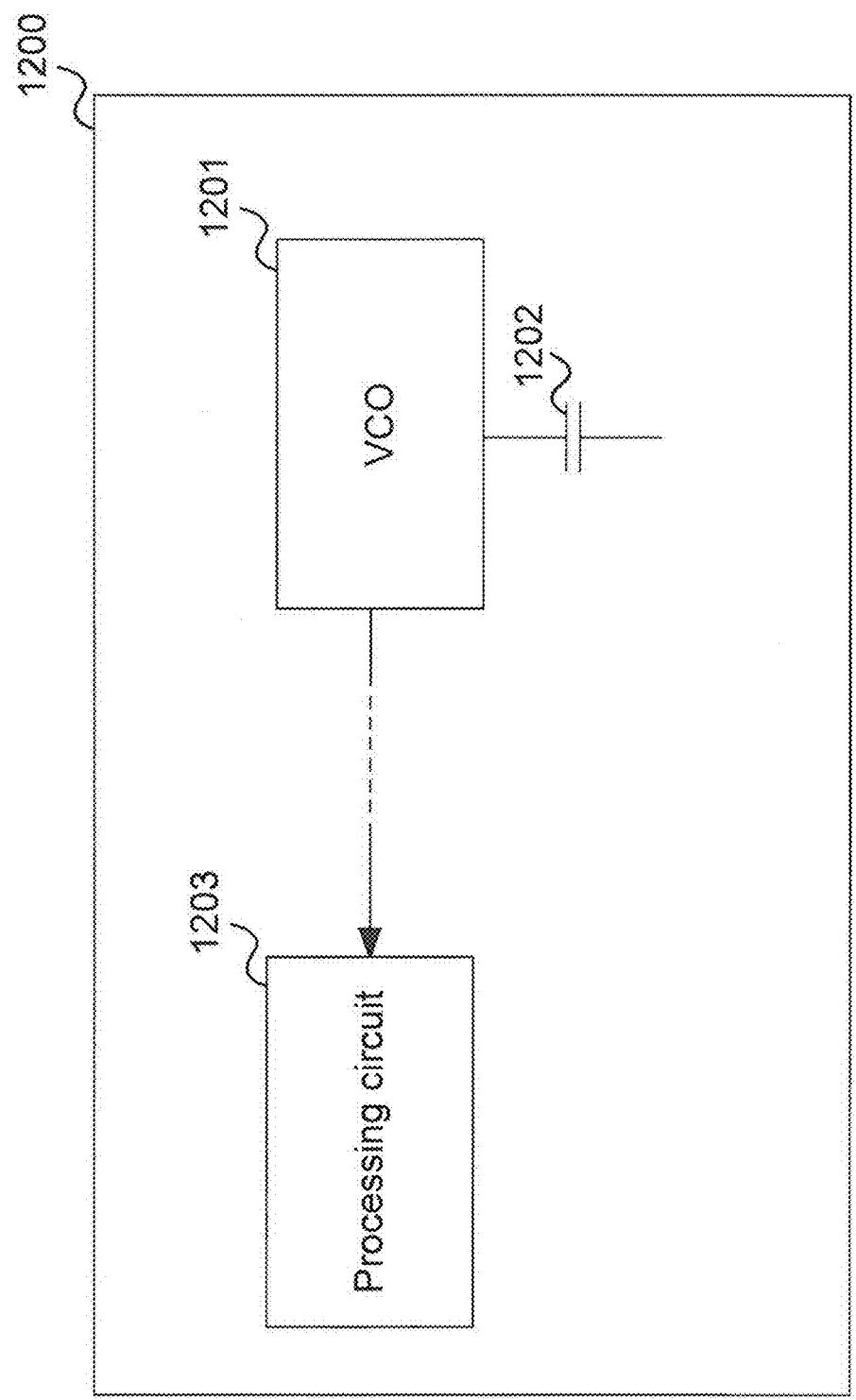
FIG. 12 shows a capacitance determination circuit according to an embodiment.

In summary, according to various embodiments, a capacitance determination circuit (e.g. a readout circuit for a MEMS) is provided as illustrated in FIG. 12.

FIG. 12 shows a capacitance determination circuit 1200 according to an embodiment.

The capacitance determination circuit 1200 includes a voltage controlled oscillator 1201 configured to generate a frequency signal whose frequency depends on a control voltage supplied to the voltage controlled oscillator 1201 and a capacitor 1202 coupled to the voltage controlled oscillator 1201 wherein the control voltage depends on a voltage across the capacitor 1202.

Further, the capacitance determination circuit 1200 includes a processing circuit 1203 configured to generate, based on the frequency signal generated by the voltage controlled oscillator 1201 over a time interval including at least one phase in which the capacitor 1202 is charged and including at least one phase in which the capacitor 1202 is discharged, an indication of the capacitance of the capacitor 1202.

In other words, the voltage over a capacitor which is successively charged and discharged (at least once but for example multiple times) controls a voltage controlled oscillator which generates a frequency signal in response. The frequency signal contains information about the capacitance of the capacitor and a processing circuit generates an indication of the capacitance based on the frequency signal and the information about the capacitance contained therein. The frequency signal is generated over a time interval which includes at least one charging of the capacitor and at least one discharging of the capacitor, e.g. a sequence of charging and discharging processes. In other words, the frequency signal is generated over at least one transition (i.e. switching) from discharging the capacitor to charging the capacitor, over at least one transition (i.e. switching) from charging the capacitor to discharging the capacitor or both (possibly multiple times). The frequency signal is generated to have phase coherence over these transitions.

In other words, a capacitance-to-digital converter is provided, for example an oversampled and noise shaped capacitance to digital quantizer which operates based on an oscillator modulated by the discharge of a sensing capacitor (e.g. of a MEMS device such as a microphone, a pressure sensor, or generally any sensor which may be implemented in form of a MEMS device).

According to various embodiments, a MEMS sensor can be seen to be formed as a part of an oscillator which allows avoiding biasing circuits, minimizing chip area and power. It also enables the scaling to small technology nodes.

The processing circuit 1203 may for example include a part of a frequency modulator (e.g. a frequency divider and optionally a trigger logic as explained with reference to FIGS. 2 and 3) and a frequency to digital converter. For example it may correspond to the FM modulator 903 without the (primary) oscillator (which may correspond to the voltage controlled oscillator 1201) and the frequency to digital sigma delta modulator 907. The output of the processing circuit 1203, i.e. the indication of the capacitance, which for example corresponds to the output of the frequency-to-digital sigma delta modulator 907 may be a digital, e.g. binary, representation, e.g. a binary value, specifying the capacitance of the capacitor (e.g. in a certain unit such as pF).

Figure 13:
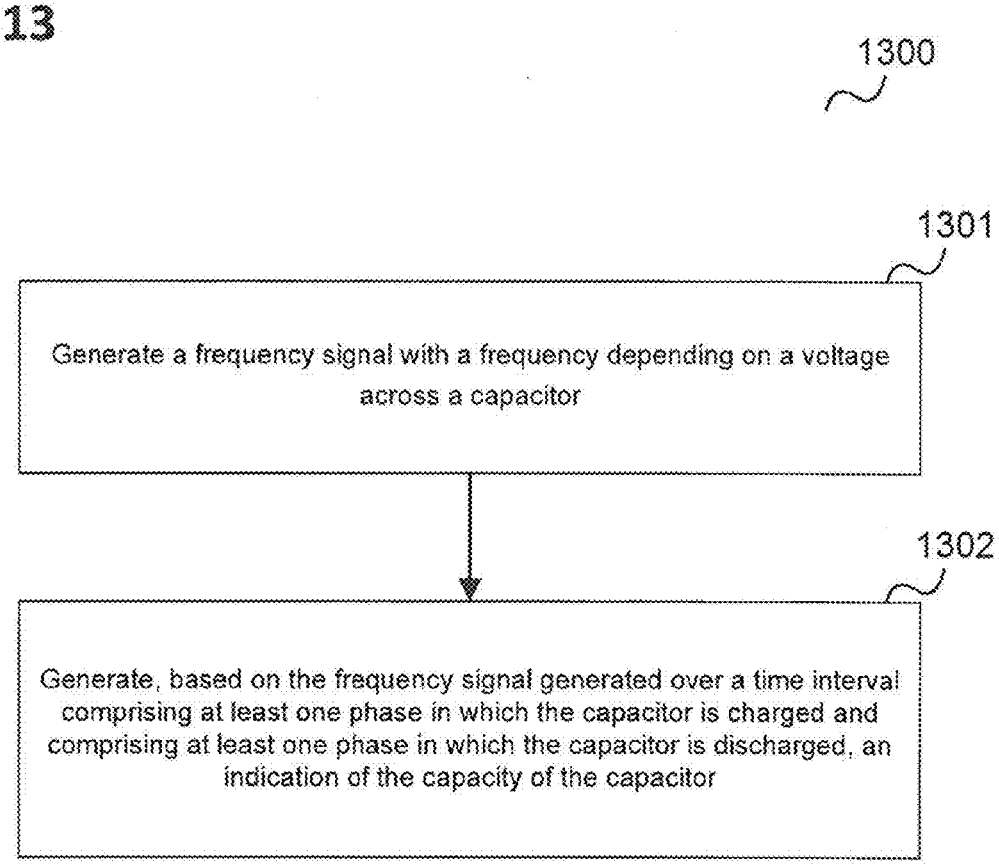
FIG. 13 shows a flow diagram illustrating a method for determining a capacitance according to an embodiment.

According to one embodiment, a method for determining a capacitance as illustrated in FIG. 13 is provided.

FIG. 13 shows a flow diagram 1300.

In 1301, a frequency signal with a frequency depending on a voltage across a capacitor is generated.

In 1302, an indication of the capacitance of the capacitor is generated based on the frequency signal generated over a time interval including at least one phase in which the capacitor is charged and including at least one phase in which the capacitor is discharged.

In the following, various embodiments are given.

Embodiment 1 is a capacitance determination circuit as illustrated in FIG. 12.

Embodiment 2 is the capacitance determination circuit of embodiment 1, further comprising a control circuit configured to control the capacitor to be charged in one or more charge phases and to be discharged in one or more discharge phases.

Embodiment 3 is the capacitance determination circuit of embodiment 2, wherein the control circuit is coupled to the voltage controlled oscillator and is configured to receive the frequency signal and to control the capacitor to be charged in one or more charge phases and to be discharged in one or more discharge phases based on the frequency signal.

Embodiment 4 is the capacitance determination circuit of embodiment 2, wherein the control circuit is configured to generate a control signal which controls the capacitor to be charged in one or more charge phases and to be discharged in one or more discharge phases based on the frequency signal.

Embodiment 5 is the capacitance determination circuit of embodiment 4, wherein the processing circuit is configured to generate the indication of the capacitance of the capacitor based on the control signal.

Embodiment 6 is the capacitance determination circuit of embodiment 4, wherein the processing circuit is configured to convert the control signal into the indication of the capacitance of the capacitor.

Embodiment 7 is the capacitance determination circuit of embodiment 6, wherein the converting of the control signal into the indication comprises noise-shaping.

Embodiment 8 is the capacitance determination circuit of embodiment 6, wherein the processing circuit comprises a frequency-to-digital converter and is configured to convert the control signal into the indication of the capacitance of the capacitor by performing a frequency-to-digital conversion of the control signal.

Embodiment 9 is the capacitance determination circuit of embodiment 4, wherein the control signal is an oscillation signal oscillating between a state which controls the capacitor to be charged and a state which controls the capacitor to be discharged.

Embodiment 10 is the capacitance determination circuit of embodiment 4, wherein the control signal controls the capacitor to be charged in one or more charge phases and to be discharged in one or more discharge phases by controlling a switch coupled to the capacitor.

Embodiment 11 is the capacitance determination circuit of embodiment 10, wherein the switch has a first state leading to the capacitor being discharged and a second state leading to the capacitor being charged.

Embodiment 12 is the capacitance determination circuit of embodiment 2, wherein the control circuit is configured to control the capacitor to be charged after a predetermined number of oscillations of the frequency signal of discharging the capacitor.

Embodiment 13 is the capacitance determination circuit of embodiment 2, wherein the control circuit is configured to control the capacitor to be discharged when the capacitor has been charged to a predetermined threshold voltage.

Embodiment 14 is the capacitance determination circuit of embodiment 2, wherein the control circuit is configured to control the capacitor to be charged when the capacitor has been discharged to a predetermined threshold voltage.

Embodiment 15 is the capacitance determination circuit of embodiment 2, wherein the control circuit is configured to control the capacitor to be discharged after a predetermined number of oscillations of the frequency signal of charging the capacitor.

Embodiment 16 is the capacitance determination circuit of embodiment 1, wherein the indication is a digital indication.

Embodiment 17 is the capacitance determination circuit of embodiment 1, comprising a frequency divider configured to generate a frequency divided signal from the frequency signal, wherein the processing circuit is configured to generate the indication based on the frequency divided signal.

Embodiment 18 is the capacitance determination circuit of embodiment 1, wherein the capacitance is the capacitance of a Microelectromechanical System device.

Embodiment 19 is the capacitance determination circuit of embodiment 1, wherein the processing circuit is configured to generate the indication based on the frequency signal generated by the voltage controlled oscillator over a time interval comprising a plurality of phases in which the capacitor is charged and comprising a plurality of phases in which the capacitor is discharged.

Embodiment 20 is a method for determining a capacitance as illustrated in FIG. 13.

According to a further embodiment, a circuit is provided including a capacitor, an oscillator configured to generate, over at least one discharging of the capacitor and at least one charging of the capacitor, a frequency signal whose frequency depends on a charging level of the capacitor and a processing circuit configured to determine, based on the frequency signal, the capacitance of the capacitor.

According to a further embodiment, a circuit is provided including a capacitor, a control circuit configured to charge and discharge the capacitor in accordance with a plurality of alternating charging and discharging phases, an oscillator configured to generate a frequency signal over the plurality of alternating charging and discharging phases whose frequency depends on a charging level of the capacitor and a processing circuit configured to generate an indication of the capacitance of the capacitor based on the frequency signal.

It should be noted that embodiments described in context of the circuit described with reference to FIG. 12 are analogously valid for the other circuits and the method illustrated in FIG. 13 and vice versa.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A capacitance determination circuit comprising:
    a voltage controlled oscillator configured to generate a frequency signal whose frequency depends on a control voltage supplied to the voltage controlled oscillator;
    a capacitor coupled to the voltage controlled oscillator wherein the control voltage depends on a voltage across the capacitor;
    a comparator coupled to the capacitor and configured to provide a comparison of an output of the capacitor with a voltage threshold and provide the comparison to a processing circuit; and
    the processing circuit configured to generate, based on the comparison and the frequency signal generated by the voltage controlled oscillator over a time interval comprising at least one phase in which the capacitor is charged and comprising at least one phase in which the capacitor is discharged, an indication of a capacitance of the capacitor, wherein the indication of the capacitance specifies the value of the capacitance of the capacitor.

2. The capacitance determination circuit of claim 1, further comprising a control circuit configured to control the capacitor to be charged in one or more charge phases and to be discharged in one or more discharge phases.

3. The capacitance determination circuit of claim 2, wherein the control circuit is coupled to the voltage controlled oscillator and is configured to receive the frequency signal and to control the capacitor to be charged in one or more charge phases and to be discharged in one or more discharge phases based on the frequency signal.

4. The capacitance determination circuit of claim 2, wherein the control circuit is configured to generate a control signal which controls the capacitor to be charged in one or more charge phases and to be discharged in one or more discharge phases based on the frequency signal.

5. The capacitance determination circuit of claim 4, wherein the processing circuit is configured to generate the indication of the capacitance of the capacitor based on the control signal.

6. The capacitance determination circuit of claim 4, wherein the processing circuit is configured to convert the control signal into the indication of the capacitance of the capacitor.

7. The capacitance determination circuit of claim 6, wherein the converting of the control signal into the indication comprises noise-shaping.

8. The capacitance determination circuit of claim 6, wherein the processing circuit comprises a frequency-to-digital converter and is configured to convert the control signal into the indication of the capacitance of the capacitor by performing a frequency-to-digital conversion of the control signal.

9. The capacitance determination circuit of claim 4, wherein the control signal is an oscillation signal oscillating between a state which controls the capacitor to be charged and a state which controls the capacitor to be discharged.

10. The capacitance determination circuit of claim 4, wherein the control signal controls the capacitor to be charged in one or more charge phases and to be discharged in one or more discharge phases by controlling a switch coupled to the capacitor.

11. The capacitance determination circuit of claim 10, wherein the switch has a first state leading to the capacitor being discharged and a second state leading to the capacitor being charged.

12. The capacitance determination circuit of claim 2, wherein the control circuit is configured to control the capacitor to be charged after a predetermined number of oscillations of the frequency signal of discharging the capacitor.

13. The capacitance determination circuit of claim 2, wherein the control circuit is configured to control the capacitor to be discharged when the capacitor has been charged to a predetermined threshold voltage.

14. The capacitance determination circuit of claim 2, wherein the control circuit is configured to control the capacitor to be charged when the capacitor has been discharged to a predetermined threshold voltage.

15. The capacitance determination circuit of claim 2, wherein the control circuit is configured to control the capacitor to be discharged after a predetermined number of oscillations of the frequency signal of charging the capacitor.

16. The capacitance determination circuit of claim 1, comprising a frequency divider configured to generate a frequency divided signal from the frequency signal, wherein the processing circuit is configured to generate the indication based on the frequency divided signal.

17. The capacitance determination circuit of claim 1, wherein the capacitance is the capacitance of a Microelectromechanical System device.

18. The capacitance determination circuit of claim 1, wherein the processing circuit is configured to generate the indication based on the frequency signal generated by the voltage controlled oscillator over a time interval comprising a plurality of phases in which the capacitor is charged and comprising a plurality of phases in which the capacitor is discharged.

19. A method for determining a capacitance comprising:
generating a frequency signal with a frequency depending on a voltage across a capacitor;
generating a comparison of a voltage output of the capacitor with a voltage threshold;
generating, based on the comparison and the frequency signal generated over a time interval comprising at least one phase in which the capacitor is charged and comprising at least one phase in which the capacitor is discharged, an indication of the capacitance of the capacitor; and
providing a digital value specifying the capacitance of the capacitor based on the indication of the capacitance.

20. The capacitance determination circuit of claim 1, wherein the processing circuit comprises a frequency to digital sigma delta modulator comprising a digital to analog converter, an oversampled frequency to digital converter, and a quantizer, wherein an output of the frequency to digital sigma delta modulator is a digital output providing the indication of the capacitance.

* * * * *